United States Patent
Tao et al.

[11] Patent Number: 5,891,802
[45] Date of Patent: Apr. 6, 1999

[54] METHOD FOR FABRICATING A METALLIZATION STACK STRUCTURE TO IMPROVE ELECTROMIGRATION RESISTANCE AND KEEP LOW RESISTIVITY OF ULSI INTERCONNECTS

[75] Inventors: Jiang Tao, Fremont; Peng Fang, San Jose, both of Calif.

[73] Assignee: Advanced Micro Devices, Inc., Sunnyvale, Calif.

[21] Appl. No.: 898,974

[22] Filed: Jul. 23, 1997

[51] Int. Cl.$^6$ ................................. H01L 21/28
[52] U.S. Cl. .................. 438/656; 438/687; 438/927; 257/762
[58] Field of Search .................. 438/687, 656, 438/927, 358; 257/762, 764, 767, 768, 769, 770, 771

[56] References Cited

U.S. PATENT DOCUMENTS

| | | | |
|---|---|---|---|
| 5,391,517 | 2/1995 | Gelatos et al. | 438/687 |
| 5,545,927 | 8/1996 | Farooq et al. | 257/762 |
| 5,656,860 | 8/1997 | Lee | 257/751 |
| 5,719,447 | 2/1998 | Gardner | 257/762 |

FOREIGN PATENT DOCUMENTS

| | | | |
|---|---|---|---|
| 5-47760 | 2/1993 | Japan | 257/762 |
| 5-102155 | 4/1993 | Japan | 438/358 |
| 5-267299 | 10/1993 | Japan | 257/762 |

*Primary Examiner*—T. N. Quach
*Attorney, Agent, or Firm*—Davis Chin

[57] ABSTRACT

There is provided an improved metallization stack structure and a method for fabricating the same so as to produce a higher electromigration resistance and yet maintain a relatively low resistivity. The metallization stack structure includes a pure copper layer sandwiched between a top thin doped copper layer and a bottom thin doped copper layer. The top and bottom thin doped copper layers produce a higher electromigration resistance. The pure copper layer produces a relatively low resistivity.

12 Claims, 1 Drawing Sheet

METHOD FOR FABRICATING A METALLIZATION STACK STRUCTURE TO IMPROVE ELECTROMIGRATION RESISTANCE AND KEEP LOW RESISTIVITY OF ULSI INTERCONNECTS

BACKGROUND OF THE INVENTION

1. Field of the Invention

This invention relates generally to semiconductor integrated circuit devices having interconnects and more particularly, it relates to an improved metallization stack structure which has a higher electromigration resistance but yet maintains a relatively low resistivity of ultra large-scale-integration (ULSI) interconnects.

2. Description of the Prior Art

As is generally known to those skilled in the art, aluminum-based alloys have been used as an interconnection material in semiconductor integrated circuit devices for the past three decades. As the size dimensions of the integrated circuit devices are becoming smaller and smaller and decreasing down to a deep sub-micron range (i.e., 0.25 μm and beyond) there has been raised a question as to the feasibility of using aluminum-based alloys as an interconnection material due to their two limiting factors. The first limiting factor of aluminum and aluminum-based alloys is because of a problem that disconnection or failure of the interconnection is liable to occur due to electromigration damage (EMD) and/or stress migration.

As defined herein, the term "electromigration" refers to a diffusion phenomenon which is based on an interaction between metal atoms in an interconnection (a metal line) and electrons moving in the interconnection. In particular, the electromigration is a phenomenon where the metal atoms migrate in the same direction as that of the electron movement. When this occurs, the resultant metal atom migration will cause an atomic vacancy or void to be formed at the location from which the metal atoms have moved, or will cause a hillock to be built up at the location where the metal atoms accumulate. When such voids are formed, the local cross-sectional area of the metal line will be decreased and the local current density in the metal line will be increased.

As explained in a paper article entitled "Copper Metallization for ULSI and Beyond" which was written by S. P. Murarka and S. W. Hymes, Solid State and Materials Sciences, Vol. 20, Issue 2, p. 87,1995, electromigration is caused by mass transport manifested as diffusion under a driving force. When a metal line is under the influence of an electric field and the current density is large enough ($\geq 10^4$ A/cm$^2$), the current can displace the metal ions and move them away from their equilibrium positions. The enhanced and directional mobility of atoms are caused by (1) the direct influence of the electric field on ionized metal atoms, and (2) the collusion of electrons with atoms, leading to a momentum transfer (called electron-wind effect) and metal atom movement. The atomic flux moves in the direction of electron flow. At the same time, vacancies move in the opposite direction and form a vacancy flux. Whenever a gradient in temperature, grain size, geometric features, current density, and crystal orientation of grains, etc., occurs, metal atoms will be accumulated or depleted, forming hillocks or voids, which eventually grow large enough to cause metal line open or short failures.

The atomic flux due to electromigration can be expressed mathematically as follows:

$$J_{atom} = \frac{DNZ \cdot \rho q j}{kT}$$

where D is the atomic diffusivity

N is the atomic density

Z is the effective charge on the moving ion o is the metal resistivity q is the electron charge j is the current density k is Boltzmann's constant T is temperature in degrees Kelvin In Table I below, there is shown the electromigration parameters for the bulk materials of silver (Ag), aluminum (Al), gold (Au), and copper (Cu). As can be seen, the failures due to electromigration appear to be the worst in aluminum.

TABLE I

| Metal | Z* | ρ(μΩ-cm) | D$_0$(cm$^2$/s) | Dif.para. O(eV) | D(cm$^2$/s) @100° C. | Z*ρD(μΩcm$^3$/s) @100° C. |
|---|---|---|---|---|---|---|
| Ag | 9.4–23.4 | 1.6 | 1.89 | 2.01 | 1.1 × 10$^{-26}$ | 2.84–7.0 × 10$^{-25}$ |
| Al | 6.5–16.4 | 2.7 | 1.71 | 1.46 | 2.1 × 10$^{-20}$ | 3.62–9.1 × 10$^{-19}$ |
| Au | 5.9–7.4 | 2.4 | 0.67 | 1.96 | 2.2 × 10$^{-27}$ | 3.05–3.8 × 10$^{-26}$ |
| Cu | 3.7–4.3 | 1.7 | 0.78 | 2.19 | 2.1 × 10$^{-30}$ | 1.3–15 × 10$^{-29}$ |

The second limiting fact or of aluminum and aluminum-based alloys is its resistivity. The pure aluminum has resistivity of about 2.7 μΩ-cm, which is significantly higher than that of pure copper (1.7 μΩ-cm). For practical integrated circuit applications, in order to increase its electromigration resistance, actual interconnects are made of aluminum alloys containing 0.5 to 2 weight-percent copper, which increases its resistivity to 3 to 3.5 μΩ-cm. In addition, the use of tungsten (W) plugs as vertical interconnects and titanium/titanium nitride as a barrier layer increases the effective final interconnect resistivity to as high as 4.5 to 5 μΩ-cm. Higher resistivity leads to higher RC delay (signal propagation delay) and limiting circuit speed.

In Table II below, there is shown a comparison of properties for different low-resistivity metals consisting of silver (Ag), aluminum (Al), gold (Au), copper (Cu), and tungsten (W). All the properties that must be considered in applications of these metals as interconnects in integrated circuits have been listed. As will be noted, silver offers the lowest resistivity, about 5% lower than that of copper. However, silver has poor electromigration resistance (see Table I). Also, silver does not adhere to silicon dioxide (SiO$_2$) or other dielectrics, and it diffuses in the silicon dioxide at a much faster rate than copper (especially under bias).

TABLE II

| Property | Metals | | | | |
|---|---|---|---|---|---|
| | Cu | Ag | Au | Al | W |
| $\rho(\mu\Omega\text{-cm})$ | 1.7 | 1.6 | 2.4 | 2.7 | 5.7 |
| Melting point (°C.) | 1085 | 962 | 1064 | 660 | 3387 |
| Atomic weight (amu) | 64 | 108 | 197 | 27 | 184 |
| TCR($\times 10^3$/K) | 4.3 | 4.1 | 4 | 4.5 | 4.8 |
| TEC($\times 10^3$/K) | 17 | 19.1 | 14.2 | 23.5 | 4.5 |
| Thermal conductivity(W/cm) | 4.0 | 4.25 | 3.15 | 2.38 | 1.74 |
| Special heat capacity(J/kg K) | 386 | 234 | 132 | 917 | 138 |
| Corrosion in air | poor | poor | excellent | good | good |
| Adhesion to $SiO_2$ | poor | poor | poor | good | poor |
| Deposition | | | | | |
| sputtering | yes | yes | yes | yes | yes |
| evaporation | yes | yes | yes | yes | yes |
| CVD | yes | ? | ? | yes(?) | yes |
| Etching | | | | | |
| dry | ? | ? | ? | yes | yes |
| wet | yes | yes | yes | yes | yes |

In view of the foregoing, there has arisen a need for developing of new interconnection materials which will posses a higher degree of resistance to electromigration damage. From the above Tables I and II, it can be noted that copper is the best choice for use as interconnect material in integrated circuits. Copper has lower resistivity (about 30% lower than that of aluminum). In addition, the melting point for copper is more than 450° C. higher and its atomic weight is more than two times heavier than that of aluminum. These properties indicate that copper will have a higher electromigration resistance than aluminum-based alloys. As a result, this would allow higher current density and narrower line width in copper interconnects, thereby improving current density and reducing interconnect resistance and capacitance, which will result in higher circuit speed.

Further, in a published article entitled "Electromigration-resistant Cu—Pd Alloy Films" which is authored by C. W. Park and R. W. Vook, Thin Solid Films, 226(1993), pp. 238–247, it is stated that copper is a prospective material for metal interconnects in microelectronic circuits since it has a high resistance to electromigration damage and a low electrical resistivity. Moreover, in order to achieve an even higher resistance to electromigration damage it was found that this could be accomplished by alloying copper (Cu) with a small amount of palladium (Pd). While the doped copper alloy exhibited a better electromigration reliability than pure copper, it suffered from the disadvantage of possessing a higher electrical resistivity than the pure copper.

Accordingly, there still exists a need of an interconnect structure which has a higher electromigration resistance but yet maintains a relatively low resistivity. The present invention represents a significant improvement over the Cu—Pd alloy structure discussed in the aforementioned Park et al. paper.

SUMMARY OF THE INVENTION

Accordingly, it is a general object of the present invention to provide a semiconductor integrated circuit device which has an improved metallization stack structure.

It is an object of the present invention to provide an improved metallization stack structure which has a higher electromigration resistance but yet maintains a relatively low resistivity.

It is another object of the present invention to provide a method for fabricating a ultra large-scale integration interconnect capable of improving copper electromigration resistance by sucking voids into doped surface layers in order to suppress the growth of voids.

In a preferred embodiment of the present invention, there is provided a metallization stack structure and a method for fabricating the same for use in ultra large-scale-integration interconnects which has a higher electromigration resistance and a relatively low resistivity. The metallization stack structure includes a bottom thin doped copper layer, a pure copper layer, and a top thin doped copper layer. The pure copper layer overlies the bottom thin doped copper layer. The top thin doped copper layer overlies the pure copper layer. The top and bottom thin doped copper layers produce high electromigration resistance for the metal stack, and the pure copper layer produces a relatively low resistivity.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
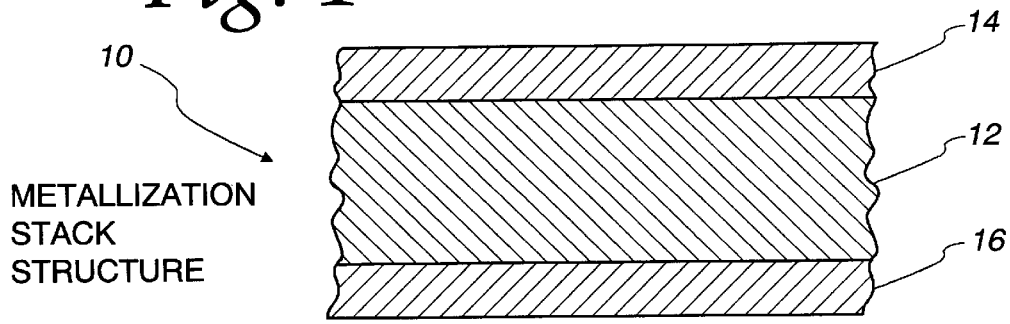
FIG. 1 is a schematic vertical sectional diagram of a metallization stack structure, constructed in accordance with the principles of the present invention.
Figure 2A:
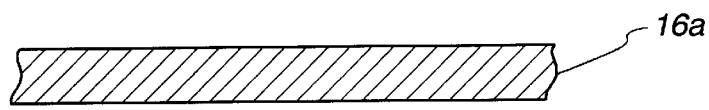
FIGS. 2(a)–2(c) are schematic vertical sectional diagrams, illustrating the fabricating steps for producing the metallization stack structure of FIG. 1.
Figure 2B:
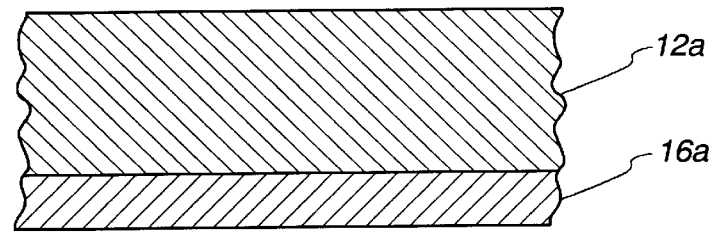
Figure 2C:
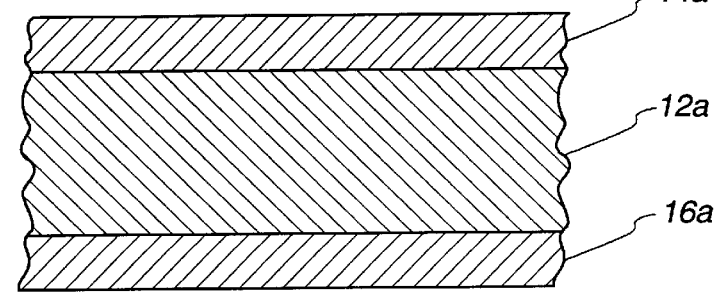

Referring now in detail to the drawings, there is shown in FIG. 1 a schematic vertical sectional diagram of an improved metallization stack structure 10, constructed in accordance with the principles of the present invention. The metallization stack structure is particularly adapted for use as an interconnect in ultra large-scale-integration semiconductor devices. In FIGS. 2(a) through 2(c), there are illustrated the fabricating steps for producing the metallization stack structure of FIG. 1.

As shown in FIG. 1, the metallization stack structure is comprised of a pure copper (Cu) layer 12 embedded or sandwiched between a top thin doped copper layer 14 and a bottom thin doped copper layer 16. The metallization stack structure has a higher electromigration resistance but yet still maintains a relatively low resistivity. The top and bottom thin doped copper layers 14 and 16 defining higher resistant cladding layers serve to minimize electromigration-induced failures, and the central pure copper layer 12 functions to permit the retention of high conductivity.

Figure 1A:
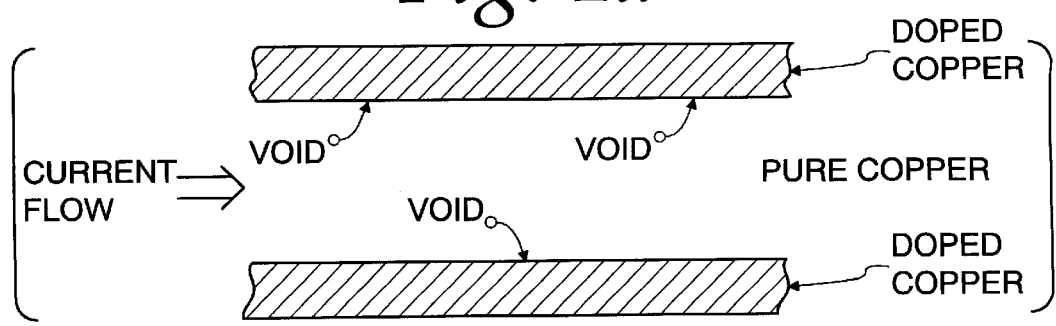
FIG. 1a is a pictorial representation of the voids moving to the top and bottom doped layers.

In other words, point defects (e.g., voids) which are induced by electrical current in the center pure copper layer 12 can be diffused into the low-current-density cladding layers 14 and 16. As a result, the formation of voids can be suppressed or avoided in the current-carrying layer 12 (center low resistant pure copper layer). This is illustrated in a pictorial representation in FIG. 1a. As can be seen, the cladding layers 14 and 16 serving as "defect" layers near the top and bottom surfaces of the pure copper layer 12 attract or soak the voids and interstitials induced during electrical stress in the pure copper layer 12. In this manner, the optimization of the electromigration resistance and the conductance of the interconnect can be decoupled.

With reference in particular to FIG. 2(a), a bottom thin doped copper (Cu) cladding layer 16a is preferably deposited by a high density sputtering process to a thickness in the range between 50 to 2,000 Å. Alternatively, the bottom thin doped copper cladding layer 16a may be deposited by chemical vapor deposition (CVD) or plasma vapor deposition (PVD). The thin doped copper layer 16a is a copper-palladium alloy containing about 0.1 to about 2.0 weight-percent palladium. While palladium is the preferred metal dopant, other metals may be selected from the group consisting of nickel (Ni), zirconium (Zr), tantalum (Ta), aluminum (Al), chromium (Cr), and titanium (Ti).

Next, a pure copper (Cu) layer 12a is preferably deposited so as to overlie the bottom cladding layer 16a by a high density sputtering process to a thickness in the range between 0.2 $\mu$m to 2 $\mu$m. Alternatively, the pure copper layer 12a may be deposited by CVD or PVD. Further, an electrodeless or electroplating process may also be used in the alternative where the thin doped copper layer 16a is used as a seeding layer for the growth of the pure copper layer 12a. This is depicted in FIG. 2(b).

Finally, a top thin doped copper (Cu) cladding layer 14a is preferably deposited so as to overlie the top surface of the pure copper layer 12a by a high density sputtering process to a thickness in the range between 50 to 2,000 Å. Alternatively, the top thin doped copper cladding layer 14a may be deposited by CVD, PVD, or ion implantation. The top thin doped copper layer 12a is likewise a copper-palladium alloy containing about 0.1 to about 2.0 weight percent palladium. Even though palladium is the preferred metal dopant, other metals may be selected from the group consisting of nickel (Ni), zirconium (Zr), tantalum (Ta), aluminum (Al), chromium (Cr), and titanium (Ti). This is illustrated in FIG. 2(c). In this fashion, the metallization stack structure 10 of the present invention in FIG. 1 is thus fabricated.

From the foregoing detailed description, it can thus be seen that the present invention provides an improved metallization stacked structure which has a higher electromigration resistance but yet maintains a relatively low resistivity. The metallization stack structure includes a pure copper layer sandwiched between a top thin doped copper layer and a bottom thin doped copper layer.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method for fabricating a metallization stack structure used in ultra large-scale-integration interconnects which has a higher electromigration resistance than aluminum-based alloys and which has a lower resistivity than the aluminum-based alloys, said method comprising the steps of:

providing a bottom doped copper layer;

forming a pure copper layer so as to overlie said bottom doped copper layer;

forming a top doped copper layer so as to overlie said pure copper layer; and said top and bottom doped copper layers producing a higher electromigration resistance than the aluminum-based alloys and said pure copper layer producing a lower resistivity than the aluminum-based alloys.

2. A method for fabricating a metallization stack structure as claimed in claim 1, wherein the step of providing the bottom layer utilizes a sputtering process.

3. A method for fabricating a metallization stack structure as claimed in claim 2, wherein said bottom doped copper layer includes a dopant selected from the group consisting of palladium, nickel, zirconium, tantalum, aluminum, chromium, and titanium.

4. A method for fabricating a metallization stack structure as claimed in claim 3, wherein said dopant is palladium.

5. A method for fabricating a metallization stack structure as claimed in claim 4, wherein said bottom layer has a thickness in the range of 50–2,000 Å.

6. A method for fabricating a metallization stack structure as claimed in claim 5, wherein the step of forming the top layer is comprised of a sputtering process.

7. A method for fabricating a metallization stack structure as claimed in claim 6, wherein said top doped copper layer includes a dopant selected from the group consisting of palladium, nickel, zirconium, tantalum, aluminum, chromium, and titanium.

8. A method for fabricating a metallization stack structure as claimed in claim 7, wherein said dopant is palladium.

9. A method for fabricating a metallization stack structure as claimed in claim 8, wherein said bottom layer has a thickness in the range of 50–2,000 Å.

10. A method for fabricating a metallization stack structure as claimed in claim 9, wherein said pure copper layer has a thickness in the range of 0.2 $\mu$m to 2 $\mu$m.

11. A method for fabricating a metallization stack structure as claimed in claim 1, wherein the step of providing the bottom layer utilizes chemical vapor deposition.

12. A method for fabricating a metallization stack structure as claimed in claim 1, wherein the step of providing the bottom layer utilizes plasma vapor deposition.

* * * * *

UNITED STATES PATENT AND TRADEMARK OFFICE
CERTIFICATE OF CORRECTION

PATENT NO.   : 5,891,802
DATED        : April 6, 1999
INVENTOR(S)  : Jiang Tao et al.

It is certified that error appears in the above-indentified patent and that said Letters Patent is hereby corrected as shown below:

Column 2, line 21, change "Z" to -- $Z^*$ --;

line 22, change "o" to -- $\rho$ --

Column 2, in Table I, below "Dif. Para.", change "O" to --$Q$--.

Signed and Sealed this

Twenty-fourth Day of August, 1999

Attest:

Q. TODD DICKINSON

Attesting Officer

Acting Commissioner of Patents and Trademarks